US012772541B2

(12) United States Patent
Flauta et al.

(10) Patent No.: US 12,772,541 B2
(45) Date of Patent: Oct. 20, 2026

(54) METHOD OF SINGULATION OF DIES FROM A WAFER

(71) Applicant: NEXPERIA B.V., Nijmegen (NL)

(72) Inventors: Randolph Estal Flauta, Hong Kong (CN); Kan Wae Lam, Nijmegen (NL); Wai Hung William Hor, Hong Kong (CN)

(73) Assignee: Nexperia B.V.

( * ) Notice: Subject to any disclaimer, the term of this patent is extended or adjusted under 35 U.S.C. 154(b) by 452 days.

(21) Appl. No.: 18/475,636

(22) Filed: Sep. 27, 2023

(65) Prior Publication Data

US 2024/0105514 A1 Mar. 28, 2024

(30) Foreign Application Priority Data

Sep. 28, 2022 (EP) .................................... 22198467

(51) Int. Cl.

| | |
|---|---|
| ***H10D 84/03*** | (2025.01) |
| ***H10P 50/00*** | (2026.01) |
| ***H10P 50/24*** | (2026.01) |
| ***H10P 50/66*** | (2026.01) |
| ***H10P 72/70*** | (2026.01) |

(52) U.S. Cl.

CPC ......... *H10D 84/038* (2025.01); *H10P 50/242* (2026.01); *H10P 50/667* (2026.01); *H10P 50/692* (2026.01); *H10P 72/7402* (2026.01); *H10P 72/7416* (2026.01)

(58) Field of Classification Search

None

See application file for complete search history.

(56) References Cited

U.S. PATENT DOCUMENTS

| | | | | |
|---|---|---|---|---|
| 7,060,531 | B2 * | 6/2006 | Arita ........................ | H10P 54/00 438/464 |
| 8,664,089 | B1 * | 3/2014 | Burghout ................ | H10P 54/00 438/33 |
| 11,756,830 | B2 * | 9/2023 | Seddon ................. | H10P 50/242 438/460 |
| 2005/0004013 | A1 | 1/2005 | Friedlander et al. | |

(Continued)

OTHER PUBLICATIONS

Choi et al. "Chemical Etching and Patterning of Copper, Silver, and Gold Films at Low Temperatures" ECS Journal of Solid State Science and Technology, 4 (1) N3084-N3093 (2015), The Electrochemical Society.

*Primary Examiner* — Nishath Yasmeen

(74) *Attorney, Agent, or Firm* — Ruggiero McAllister & McMahon LLC

(57) ABSTRACT

The present disclosure relates to a method of singulation of dies from a wafer, the wafer includes a semiconductor layer and a coating applied to the backside of the wafer after backgrinding, and the coating includes at least one metallization layer, the dies being separated along saw streets running in multiple directions. The method includes the steps of: dicing the wafer along the saw streets from a topside of the wafer; and the dicing is performed through plasma dicing for a dicing depth corresponding to the interface between the semiconductor layer and the coating. The method further includes the step of: etching the wafer in accordance with an etch mask corresponding to the saw streets, for each of the remaining metallization layers in the coating, and for singulating the dies from the wafer.

18 Claims, 2 Drawing Sheets

(56) References Cited

U.S. PATENT DOCUMENTS

| | | | | |
|---|---|---|---|---|
| 2007/0262420 | A1* | 11/2007 | Arita | H01J 37/32082 257/E23.179 |
| 2010/0120227 | A1* | 5/2010 | Grivna | H10P 54/00 257/E21.214 |
| 2011/0244657 | A1* | 10/2011 | Grivna | H10P 54/00 257/E21.599 |
| 2014/0094018 | A1* | 4/2014 | Falvo | B28D 5/00 438/463 |
| 2014/0357055 | A1* | 12/2014 | Gissibl | H10P 14/418 438/704 |
| 2019/0013242 | A1 | 1/2019 | Molla et al. | |
| 2019/0368053 | A1* | 12/2019 | Kim | C09K 13/00 |

* cited by examiner

METHOD OF SINGULATION OF DIES FROM A WAFER

CROSS-REFERENCE TO RELATED APPLICATIONS

This application claims the benefit under 35 U.S.C. § 119(a) of European Application No. 22198467.7 filed Sep. 28, 2022, the contents of which are incorporated by reference herein in their entirety.

BACKGROUND

1. Field of the Disclosure

The present disclosure is directed to a method of singulation of dies from a wafer wherein the wafer comprises a semiconductor layer and a coating applied to the backside of the wafer after backgrinding.

2. Description of the Related Art

Integrated circuit dies are formed on semiconductor wafers. Each wafer, depending in the dimensions of the wafer and the die, may comprise a large number of dies. The dies are separated from the wafer in a process known as die singulation. US 2014/094018 A1, US 2019/013242 A1 and US 2014/357055 A1 disclose methods for singulating dies from a wafer. Singulating dies is done through wafer dicing.

Through dicing the wafer is cut in unused sections between the dices which are called the saw streets. With the increase of ratio between used and unused area of the wafer, the need for more accurate wafer dicing methods increases as well, and especially, dicing methods which are accurate but also have small saw street widths.

Although mechanical sawing with a dicing saw is a well-established technique, which allows accurate dicing along the saw streets, its saw width is relatively large, thereby requiring relatively large saw streets, thus larger unused wafer area.

Stealth dicing is another singulation method in which a laser interacts with the semiconductor material at a focal point and allows smaller saw streets, thus lowering the area amount of unused area of the wafer. But stealth dicing is expensive and requires additional measures such as tape expansion tools and optimum streets alignment along the crystalline axis of the semiconductor material. Plasma etching is a promising technique of die singulation in which the semiconductor material is etched using a dry etching technique which achieves high-speed singulation with high aspect ratio (high saw depth versus narrow saw street width).

Wafers with power devices typically are being backgrinded and subsequently provided with coating layer on the grinded back side, which coating may have one, two, or typically three or even more metallization layers. Due to these metallization layers, plasma etching is very challenging due to its poor selectivity and not the preferred singulation method for such wafers as etching the metallization layers is very slow and significantly hindering the production throughput. Especially for multiple, different metallization layers, this will become even more difficult.

SUMMARY

It is an object of the present disclosure to provide for an improved method of singulating dies from a wafer, for those wafers having a coating of one or more metallization layers on a backside, which coatings are typical for wafer with dies for power devices, and which singulation method has the advantage of using plasma etching, but wherein the disadvantages related thereto are resolved.

In a first aspect, there is provided a method of singulation of dies from a wafer, the wafer comprising a semiconductor layer and a coating applied to the backside of the wafer after backgrinding, and wherein the coating comprises at least one metallization layer, the dies being separated along saw streets running in multiple directions, the method comprising the steps of: dicing the wafer along the saw streets from a topside of the wafer; wherein the dicing is performed through plasma dicing for a dicing depth corresponding to the interface between the semiconductor layer and the coating, and the method further comprising the step of: etching the wafer in accordance with an etch mask corresponding to the saw streets, for each of the remaining metallization layers in the coating, for singulating the dies from the wafer.

It was the insight of the inventors that the disadvantage of the plasma etching can be resolved by a hybrid method of singulating the dies in which the plasma etching in a two-step dicing process is combined with a metal etching step.

Plasma etching has the advantage of having small saw or kerf widths, which may even be as small as 15 to 20 um. This increases the yield per wafer by more than 15% when compared to traditional mechanical sawing which has a kerf width of at least 50 um. As such, the ratio between used and unused area on the wafer, is further increased, maximizing the utilization of the wafer.

Plasma dicing further has the advantage that it allows different types of die shapes, whereas mechanical sawing and laser stealth dicing only allow straight saw streets which typically consist of a first and second direction, perpendicular to each other. Plasma dicing allows any die shape, i.e. rounded and chamfered edges of the dies, and gives stress-free separation of the devices especially for thin dies in the range of 50-100 um.

Hence, plasma dicing is very effective and the preferred singulation process for dicing semiconductor material such as silicon, but for power devices, however, the backside of the wafer is typically grinded and subsequently provided with a coating which makes plasma dicing challenging. Since the coating is a metallic coating, consisting of one, two or typically three or even more different metallic materials, and due to the poor selectivity of the plasma dicing step, dicing these metallic layer(s) is slow and hinder the production throughput. Increase in the number of layers of different material make it even further complicated.

The inventors had the insight that even for wafers with metallic coatings, plasma dicing could be used, but only for the part of the wafer for which the plasma dicing is effective. For the remaining part, being the metallic layers of the coating, a second dicing step is suggested, which step consist of etching by a chemical etch in which each layer of the coating is etched with a chemical etchant corresponding to the layer in the coating. Hence, in case of a coating of three different metallic layers, the plasma dicing is used to dice the wafer to a dicing depth corresponding to the interface between the semiconductor layer(s) and the metallization layers applied as coating on the backside of the wafer.

The etching step, being the second step of the dicing process according to the present disclosure, may performed as a step metal etching process, which removes the backside metallization layers and thereby singulates or separates the dies completely from the wafer.

The present disclosure is especially useful for power integrated circuits, wherein the dies is a semiconductor typically comprises of silicon which, after the wafer is grinded on the backside, is provided with a coating of one, two, three or more metallization layers.

In an example, the method further comprises the step of: applying a layer of photoresist as etch mask on the topside of the wafer for the step of etching the wafer in accordance with the etch mask.

In an example, the layer of photoresist is applied in correspondence with the saw streets and covering bond pads of the dies.

In an example, the layer of photoresist is applied prior to the first step of plasma dicing.

For the second step of the dicing, i.e. the etching step, following the plasma dicing, the wafer is still covered with a layer of photoresist. The photoresist is used as mask for the second step and corresponds with the saw streets in the first dicing step. Accordingly, the result is that the first and second dicing steps have equal or at least highly similar dicing patterns, which is beneficial.

In an example, the method further comprises the step of, after the step of etching the metallization layers in the coating, removing the layer of photoresist.

After the second dicing step, i.e. the etching step following the plasma dicing, the layer of photoresist may be removed and the dies are ready for further processing in the IC manufacturing process, in which these are removed from the wafer tape.

In an example, the step of etching the metallization layers in the coating comprises wet etching the metallization layers on a layer-per-layer basis.

In an example, the wet etching is repeated for each metallization layer in the coating and comprises suitable metal etchant for a respective layer.

The etching of the metallization layers in the second step of dicing, may be performed by suitable etchants, which, depending on the type of metallic layer may comprise for example a Al etchant (for the ohmic contact layer), Ti etchant, NiV etchant, Ag etchant and/or hydrochloric, nitric, phosphoric, or hydrofluoric acid or its combination thereof (for the backside metallization).

In an example, the method further comprises the step of, prior to the step of dicing the wafer, attaching the wafer to a protective wafer tape on the backside of the wafer.

Typically, the wafer coated with metallization layers at the backside is attached or fixed by use of a tape or wafer tape. The tape assures that the dies are kept in place once these are singulated and such that the tape of dies may be used further downstream the IC manufacturing process.

In an example, the coating comprises of an ohmic contact (Al layer) and three backside metallization layers.

In an example, the three metallization layers comprise one of titanium, nickel-vanadium alloy and silver.

Typically, a semiconductor for power devices may have a backside which is thinned or grinded, and subsequently provided with a coating of three metallization layers. These layers are preferably, in the order from the backside to topside, silver, nickel-vanadium and titanium. The skilled person will appreciate that the coating may also comprise less than, or more than three layers, and that the layers may comprise other types of materials than the ones listed above.

In an example, the saw streets are configured for each dies to have a rectangular shape, square shape or hexagonal shape.

In an example, the saw streets are configured for each dies to have one or more of rounded edges, chamfered edge.

For several reasons, the dies may have non-conventional shapes. Conventional shapes are considered square or rectangular shaped dies which have such a shape due to the limitations of dicing by mechanical sawing. Using plasma dicing however also allows other and more complex shapes such as hexagonal shapes, and shapes having rounded edges or chamfered edges which. Hence, such complex shapes may be separated in a stress-free manner by plasma dicing.

In an example, the saw street width is below 50 um, preferably below 30 um, more preferably below 20 um.

Plasma dicing may allow small saw street widths with dicing kerf widths or below 50 micron or below 30 micron or even between 15 and 20 micron.

In an example, the semiconductor material comprises silicon.

Typically, the wafer comprises semiconductor material comprised of silicon, gallium arsenide, silicon carbide, gallium nitride or a combination thereof.

In a second aspect, there is provided, a semiconductor die having a coating applied to a grinded backside of the die, wherein the coating comprises at least one metallization layer, and wherein the die is singulated from the wafer in accordance with the first aspect of the present disclosure, or any example thereof.

The definitions and advantages of the first aspect of the present disclosure are also applicable to any of the other aspects of the present disclosure.

The above and other aspects of the disclosure will be apparent from and elucidated with reference to the examples described hereinafter.

DETAILED DESCRIPTION

Figure 1:
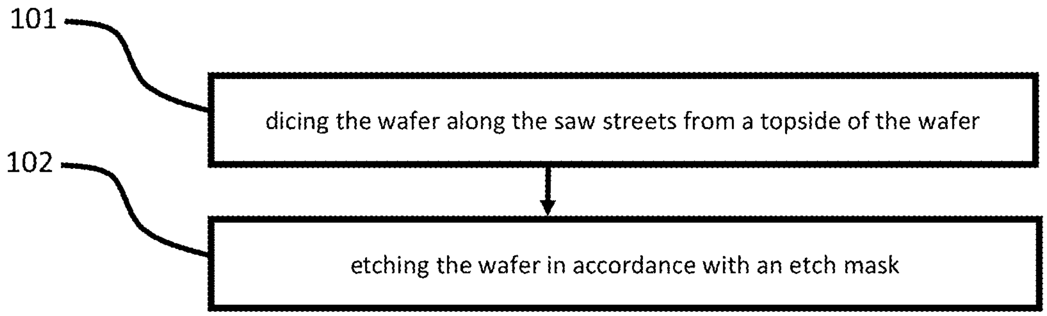
FIG. 1 discloses the steps of the method of singulation of dies from a wafer in accordance with the first aspect of the present disclosure.

It is noted that in the description of the figures, same reference numerals refer to the same or similar components performing a same or essentially similar function.

FIG. 1 discloses a method of singulation of dies from a wafer. The process of singulation is a typical step in the manufacturing process of integrated circuits. Depending on dimensions of the wafer and the size of the die, a wafer may comprise a large number of dies. Plasma dicing of the wafer (for example Si, SiC/GaN on Si, GaAs, InP) is a preferred singulation process which can reduce the kerf width down to 15-20 um thus increasing the yield per wafer by >15% when compared to traditional mechanical sawing which has a kerf width of at least 50 um thus maximizing the utilization of the wafer.

Plasma dicing is also suitable for chamfered or rounded edge giving stress-fee separation of devices especially for thin dies in the range of 50-100 um. However, for power device wafers with backside metallization, continued plasma etching of backside metal layers along the saw street is a very slow process and significantly hinder the production throughput. This will become more complicated when plasma etching different metallization layers. An alternate method is laser scribing (relatively slow compared to plasma dicing), tedious, and will further enlarge the kerf width due to the heat affected zone generated during the laser scribing process.

In the present disclosure a method is disclosed of singulating dies (e.g. shaped dies with rounded edges) which comprise a backside metallization, through a 2-step process first comprising plasma dicing and subsequently, a step of metal etching.

FIG. 1, shows some of the steps of singulating dies in a simplified flowchart. The dies are singulated from the wafer which comprises a plurality of layers, among which a semiconductor layer, and a coating applied to the backside of the wafer after the wafer is backgrinded. The coating comprises at least one metallization layer which is difficult and slow to be diced through plasma dicing. Each of the dies is separated along saw streets which run in multiple direction.

The method shown in FIG. 1 at least comprises the first step 101 of dicing the wafer along the saw streets from a topside of the wafer. This wafer dicing step, or in particular, the wafer dicing steps, is/are performed through plasma dicing for a certain dicing depth. This depth may be defined as the interface between the semiconductor layer and the coating, i.e. the metallization layers applied to the backside of the wafer after the wafer is backgrinded.

After the first step of the method, in the second step, 102. The wafer is further diced to be singulated by an etch step, or more in particular, several etch steps for each of the metallization layers applied as coating to the backside of the wafer. Once each metallization or coating layer has been etched accordingly, and hence, in accordance with the saw streets, thus in accordance with the dicing pattern of the semiconductor layer, the die is singulated from the wafer and can be separated by removing it from the temporary protective wafer tape.

Figure 2:
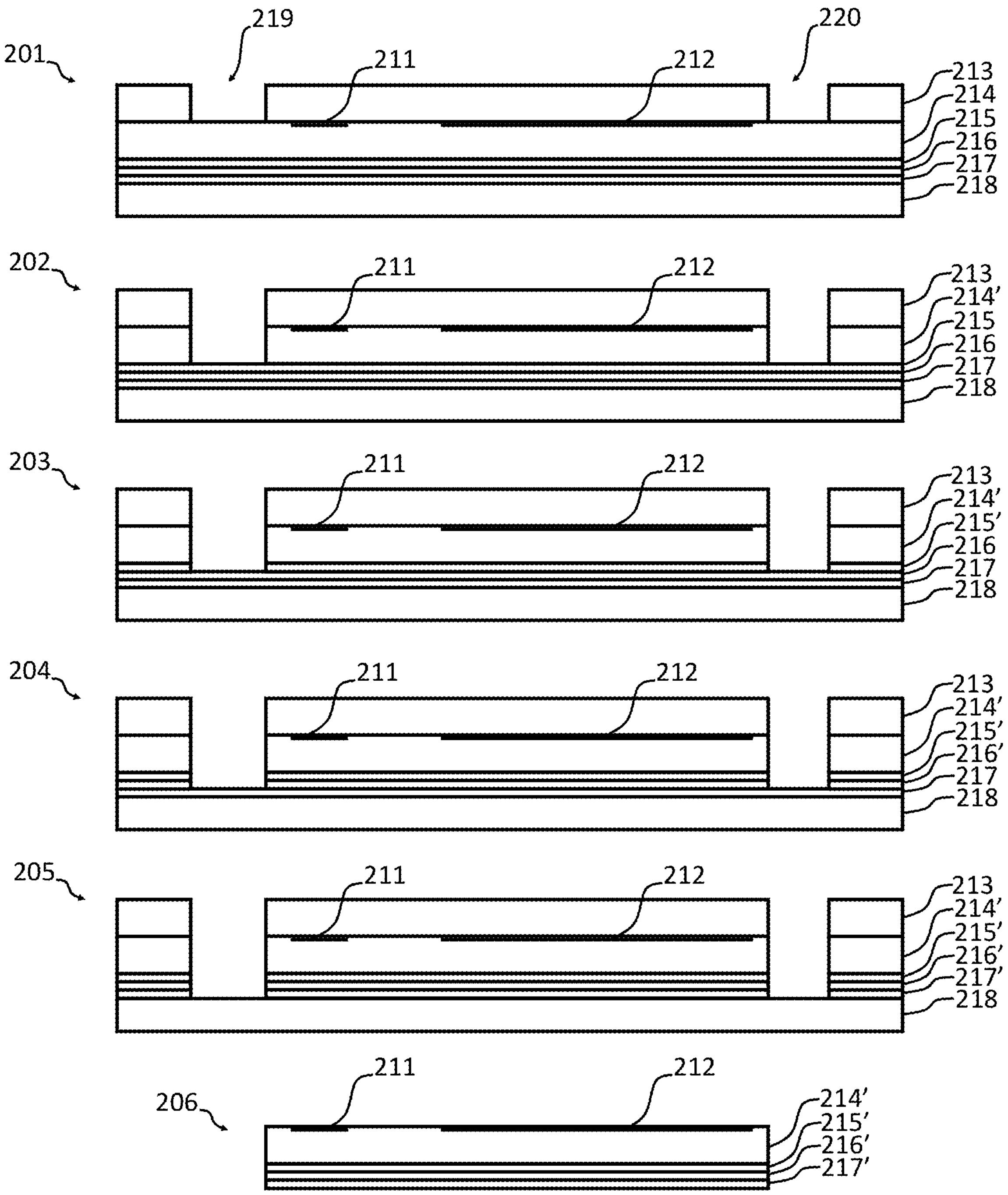
FIG. 2 discloses several steps of the method of singulation of dies from a wafer in accordance with another aspect of the present disclosure.

FIG. 2 shows in more detail several individual steps of singulating a die from a wafer. In the first step, 201, the wafer comprises several layers. The semiconductor layer, 214, may be considered the top layer, having several bond pads 211, 212 on the top surface thereof. Prior to performing the plasma dicing, the semiconductor layer 214 is covered, at the top side of the wafer, with a photoresist 213 to protect the bond pads (e.g. the source and gate pads), and to expose only the dicing lanes 220, 221 as shown in step 201 of FIG. 2. The semiconductor layer 214 may comprise a material such as silicon but may also comprise other typical semiconductor materials such as Silicon Carbide, Gallium Nitride, Gallium Nitride on Silicon carbide, or other III-V substrate wafers. The silicon wafer may be a small size wafer or a large size wafer, up and above 12 inch dimensions, whereas the silicon die thickness can be in range of at least −50 um to 100 um or even thicker. The skilled person will appreciate which typical semiconductor materials may also be used in the semiconductor layer.

In step 202 the plasma dicing step is executed, resulting in a diced semiconductor material layer 214', which is diced to such depth that all of the semiconductor material along the saw streets 219, 220 is diced until the metallization layers 215, 216, 217, are exposed at the bottom part of the water.

In the example shown in FIG. 2, the wafer is provided with a backside coating comprised of three metallization layers, i.e. a Titanium layer, Ti, 215, a Nickel layer, Ni, 216, and a Silver layer, Ag, 217. Below the metallization layers is a protective wafer tape 218, or dicing tape is used during the wafer dicing to hold the dies in place during and after the dicing steps.

Step 203, defines the first step of the second stage of the combined plasma dicing and step etching according to the present disclosure. In this step 203, the first metallization layer, being the titanium layer 215' is etched with a suitable etchant, for example a $HNO_3$:$HPO_4$:DI $H_2O$:HCL=5:50:43:2, as for example described in US 2005/0040139 A1. The titanium layer 215' may be etched at an etch rate of approximately 628 nm/m in.

In step 204, the nickel or nickel-vanadium layer 216' is etched with a suitable etchant which may correspond with the etchant described above for the titanium layer 215', however, with a suitable etch rate of for example, approximately 57 nm/min.

Finally, in step 205, the last of the metallization layers, the silver layer 216' has been etched with a silver etchant such as 0.1M $Fe(NO_3)$ as for example described in TS Choi, DW Hess, ECS Journal of Solid State Science and Technology, 4 (1) N3084-N3093 (2015), which may be used at an etch rate of 2800 nm/m in.

The three step etching of the metallization layers, 203, 204, 205 can be done relatively fast, as step 203 may require approximately only 2 minutes, step 204 approximately 6 minutes and step 205 approximately 2 min. Further, these etching steps also have the advantage that they are compatible to mass production and the etchants are readily available and inexpensive. Also, the etching of the metallization layers can be done in panel level wherein several wafers are placed in a panel for high volume processing. The etch steps proposed also follow the kerf width defined by the preceding step of the plasma dicing, by which the narrow kerf width is maintained throughout the whole singulation. Alternative singulation methods may also induce additional heat due to high temperatures resulting in heat affected zones, i.e. in case of laser scribing, and/or may result in stress in dies, i.e. induced mechanical stress in mechanical sawing. Etching the metallization layers is relatively free of stress without forming heat affected zone.

Once the semiconductor material is removed by the plasma dicing in step 202, and the metallization layers are removed by chemical etching, 203, 204, 205, the photoresist 213 may be removed. The dies are then finally singulated by removing them from the protective wafer tape 218, resulting in a final die 206 having an exposed gate pad 211, source pad 212 and a drain pad 217' as the exposed backside metallization layer 217'.

Other variations to the disclosed embodiments can be understood and effected by those skilled in the art in practicing the claimed disclosure, from a study of the drawings, the disclosure and the appended claims. In the claims, the word “comprising” does not exclude other elements or steps, and the indefinite article “a” or “an” does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A method of singulation of dies from a wafer, wherein the wafer has a backside, a topside and comprises a semiconductor layer and a coating applied to the backside of the wafer after backgrinding, wherein the coating comprises at least one metallization layer, wherein the dies are separated along saw streets running in multiple directions, wherein the method comprises the steps of:

applying a layer of photoresist as an etch mask on the topside of the wafer for the step of etching the wafer in accordance with the etch mask;

dicing the wafer along the saw streets from the topside of the wafer; wherein the dicing is performed through plasma dicing for a dicing depth corresponding to the interface between the semiconductor layer and the coating, and wherein the layer of photoresist is applied prior to the step of dicing, wherein the method further comprises the step of:

etching the wafer in accordance with an etch mask corresponding to the saw streets, for each of the remaining metallization layers in the coating, for singulating the dies from the wafer.

2. The method of singulation of dies from a wafer according to claim 1, wherein the layer of photoresist is applied in correspondence with the saw streets and covers bond pads of the dies.

3. The method of singulation of dies from a wafer according to claim 1, further comprising the step of, after the step of etching the metallization layers in the coating, removing the layer of photoresist.

4. The method of singulation of dies from a wafer according to claim 1, wherein the step of etching the metallization layers in the coating comprises wet etching the metallization layers on a layer-per-layer basis.

5. The method of singulation of dies from a wafer according to claim 4, wherein the wet etching is repeated for each metallization layer in the coating and for a respective layer, and comprises at least one acid selected from the group consisting of hydrofluoric acid, nitric acid, phosphoric acid, and hydrochloric acid and any combinations thereof, and ferric nitrate.

6. The method of singulation of dies from a wafer according to claim 1, further comprising the step of, prior to the step of dicing the wafer, attaching the wafer to a protective wafer tape on the backside of the wafer.

7. The method of singulation of dies from a wafer according to claim 1, wherein the coating comprises three metallization layers.

8. The method of singulation of dies from a wafer according to claim 7, wherein the three metallization layers comprise at least one material selected from the group consisting of titanium, nickel-vanadium alloy, and silver.

9. The method of singulation of dies from a wafer according to claim 1, wherein the saw streets are configured for each die to have at least one shape selected from the group consisting of a rectangular shape, a square shape, and a hexagonal shape.

10. The method of singulation of dies from a wafer according to claim 1, wherein the saw streets are configured for each die to have at least one edge selected from the group consisting of rounded edges, and chamfered edges.

11. The method of singulation of dies from a wafer according to claim 1, wherein the saw street width is below 50 um.

12. The method of singulation of dies from a wafer according to claim 1, wherein the semiconductor material comprises silicon.

13. The method of singulation of dies from a wafer according to claim 2, wherein the saw streets are configured for each die to have at least one shape selected from the group consisting of a rectangular shape, a square shape, and a hexagonal shape.

14. The method of singulation of dies from a wafer according to claim 2, wherein the saw streets are configured for each die to have at least one edge selected from the group consisting of rounded edges, and chamfered edges.

15. The method of singulation of dies from a wafer according to claim 2, wherein the saw street width is below 50 um.

16. The method of singulation of dies from a wafer according to claim 2, wherein the semiconductor material comprises silicon.

17. The method of singulation of dies from a wafer according to claim 3, further comprising the step of, after the step of etching the metallization layers in the coating, removing the layer of photoresist.

18. The method of singulation of dies from a wafer according to claim 3, wherein the step of etching the metallization layers in the coating comprises wet etching the metallization layers on a layer-per-layer basis.

* * * * *